(12) United States Patent
Avramescu et al.

(10) Patent No.: US 7,773,431 B2
(45) Date of Patent: Aug. 10, 2010

(54) SYSTEMS AND METHODS FOR READING DATA FROM A MEMORY ARRAY

(75) Inventors: Radu Avramescu, Frisco, TX (US); Sumanth Gururajarao, Dallas, TX (US); Hugh Thomas Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 60 days.

(21) Appl. No.: 12/337,946

(22) Filed: Dec. 18, 2008

(65) Prior Publication Data

US 2009/0097327 A1    Apr. 16, 2009

Related U.S. Application Data

(62) Division of application No. 11/594,602, filed on Nov. 8, 2006, now Pat. No. 7,477,551.

(51) Int. Cl.
*G11C 7/10* (2006.01)
(52) U.S. Cl. ............... 365/189.02; 365/189.03; 365/189.15; 365/189.08; 365/202
(58) Field of Classification Search ............ 365/189.02, 365/189.03, 189.15, 189.08, 202
See application file for complete search history.

(56) References Cited

U.S. PATENT DOCUMENTS

| | | | |
|---|---|---|---|
| 4,658,377 A | | 4/1987 | McElroy |
| 5,233,558 A | * | 8/1993 | Fujii et al. ............ 365/189.14 |
| 5,278,785 A | | 1/1994 | Hazani |
| 5,280,441 A | | 1/1994 | Wada et al. |
| 5,440,518 A | | 8/1995 | Hazani |
| 5,535,167 A | | 7/1996 | Hazani |
| 5,535,172 A | | 7/1996 | Reddy et al. |
| 5,548,596 A | | 8/1996 | Tobita |
| 5,650,979 A | | 7/1997 | Komarek et al. |
| 5,659,514 A | | 8/1997 | Hazani |
| 5,784,327 A | | 7/1998 | Hazani |
| 5,825,715 A | | 10/1998 | Rezeanu |
| 5,828,610 A | * | 10/1998 | Rogers et al. ............ 365/203 |
| 5,883,826 A | | 3/1999 | Wendell et al. |
| 5,896,334 A | | 4/1999 | Casper et al. |
| 5,898,617 A | * | 4/1999 | Bushey et al. ............ 365/185.2 |
| 5,901,086 A | | 5/1999 | Wang et al. |
| 5,933,386 A | | 8/1999 | Walker et al. |

(Continued)

*Primary Examiner*—Viet Q Nguyen
(74) *Attorney, Agent, or Firm*—Ronald O. Neerings; Wade James Brady, III; Frederick J. Telecky, Jr.

(57) ABSTRACT

One embodiment of the present invention includes a column multiplexer for accessing data from a memory array comprising an output node having a logic state that is based on a logic state of a control node, and column elements, each comprising a first pair of series connected switches controlled by a column select signal and a bit line signal associated with data stored in a plurality of memory cells. The first pair of switches is configured to set the control node to a logic low state based on a logic state of the bit line signal. The column elements each also comprise a second pair of series connected switches controlled by the bit line signal and a complement of the column select signal. The second pair of switches is configured to set the control node to a logic high state based on the logic state of the bit line signal.

8 Claims, 5 Drawing Sheets

U.S. PATENT DOCUMENTS

| | | |
|---|---|---|
| 5,963,486 A | 10/1999 | Yeung et al. |
| 6,104,653 A | 8/2000 | Proebsting |
| 6,118,727 A | 9/2000 | Allan et al. |
| 6,185,140 B1 | 2/2001 | Agrawal |
| 6,222,777 B1 * | 4/2001 | Khieu .................. 365/189.02 |
| 6,240,047 B1 | 5/2001 | Koelling et al. |
| 6,256,253 B1 * | 7/2001 | Oberlaender et al. ... 365/230.02 |
| 6,292,401 B1 | 9/2001 | Zhang et al. |
| 6,459,630 B2 * | 10/2002 | Nakayama et al. .......... 365/200 |
| 6,501,302 B1 | 12/2002 | Lee et al. |
| 6,507,524 B1 * | 1/2003 | Agrawal et al. ............. 365/200 |
| 6,631,093 B2 | 10/2003 | Kumar et al. |
| 6,711,051 B1 * | 3/2004 | Poplevine et al. ........... 365/154 |
| 6,741,487 B2 | 5/2004 | Yokozeki |
| 6,922,370 B2 | 7/2005 | Deng et al. |
| 7,068,556 B2 | 6/2006 | De La Cruz et al. |
| 7,088,627 B1 * | 8/2006 | Bajwa et al. ................ 365/200 |
| 7,177,176 B2 | 2/2007 | Zheng et al. |
| 7,193,924 B2 | 3/2007 | Ramaraju et al. |
| 7,277,325 B2 | 10/2007 | Fukuda et al. |
| 7,394,681 B1 * | 7/2008 | Masleid ...................... 365/154 |
| 7,477,551 B2 * | 1/2009 | Avramescu et al. .... 365/189.02 |
| 7,643,330 B1 * | 1/2010 | Lin et al. .................... 365/154 |
| 2002/0176310 A1 | 11/2002 | Hilbert |
| 2005/0128852 A1 | 6/2005 | Deng et al. |
| 2005/0247981 A1 | 11/2005 | Wang |

* cited by examiner

SYSTEMS AND METHODS FOR READING DATA FROM A MEMORY ARRAY

This application is a Divisional of application Ser. No. 11/594,602 filed Nov. 8, 2006 now U.S. Pat. No. 7,477,551.

TECHNICAL FIELD

This invention relates to electronic circuits, and more specifically to systems and methods for reading data from a memory array.

BACKGROUND

Static random access memory (SRAM) is a type of RAM that uses transistor driven memory cells to latch bits of data for memory storage and is used in a large variety of consumer electronics, such as computers and cellular telephones. Memory cells in an SRAM circuit are typically arranged in an array, such that the SRAM includes individually addressable rows and columns to which data can be written and from which data can be read. The individually addressable rows and columns are controlled by peripheral circuitry that receives decoded signals corresponding to memory locations, which could be generated from a processor, such that the peripheral circuitry determines which of the memory cells in the array are accessed for read and write operations at any given time. Typically, during a read operation, an accessed memory row outputs its data content onto complementary pairs of column bit lines, with the data content of each of the complementary pair of column bit lines being switched to a complementary bit-level read output of a column multiplexer. The complementary bit-level read output is input to a differential sense amplifier for a determination of the data value.

Typical SRAM memory arrays are optimized for a large number of memory rows. However, in applications better suited for smaller memory arrays, a differential amplifier can become impractical due to its large size. In smaller memory arrays, it may be more area efficient to use gate type sense circuits instead of a differential amplifier. However, a gate-type sense circuit limits the array to a smaller number of memory rows (e.g., 8-32 memory rows) in order to achieve performance. The memory array could be partitioned in multiple banks having 8-32 rows, with each bank having a gate-type sense circuit. However, too many banks of rows defeats the purpose of reducing the size of the memory array. Hence, the gate type sense approach is typically used for relatively small memory arrays only. In addition, in a memory array having a low number of memory rows, a column multiplexer can apply an undesirable load on the column bit lines, such that the speed of the SRAM memory array can be reduced.

SUMMARY

One embodiment of the present invention includes a column multiplexer for accessing data from a memory array. The column multiplexer comprises an output node having a logic state that is based on a logic state of a control node, and column elements, each of which comprises a first pair of series connected switches controlled by a column select signal and a bit line signal associated with data stored in one of a plurality of memory cells. The first pair of switches are configured to set the control node to a logic low state based on a logic state of the bit line signal. Each of the column elements also comprises a second pair of series connected switches controlled by the bit line signal and a complement of the column select signal. The second pair of switches are configured to set the control node to a logic high state based on the logic state of the bit line signal.

Another embodiment of the present invention includes a method of reading data from a memory array. The method comprises asserting a column select signal that is associated with a column of memory cells in the memory array and pre-charging a bit line signal. The bit line signal can be associated with data stored in a memory cell of the column of memory cells. The method also comprises switching a control node between a positive supply voltage rail and a negative supply voltage rail based on a logic state of the bit line signal and generating a data read output that is based on a logic state of the control node. The data read output can be associated with the data stored in the memory cell of the column of memory cells.

Another embodiment of the present invention includes a column multiplexer for accessing data from a memory array. The column multiplexer comprises means for selecting a column of memory cells in the memory array and means for pre-charging a bit line signal. The bit line signal can be associated with data stored in a memory cell of the column of memory cells. The column multiplexer also comprises means for switching a control node between a positive supply voltage rail and a negative supply voltage rail based on a logic state of the bit line signal and means for providing an output of the column multiplexer based on a logic state of the control node. The output can be associated with the data stored in the memory cell of the column of memory cells.

DETAILED DESCRIPTION

The present invention relates to electronic circuits, and more specifically to systems and methods for reading data from a memory array. Single-ended bit lines are input from a memory array into a column multiplexer. The bit lines can each correspond to a column of the memory array. The bit lines can be individually selected via at least one column select signal. The bit lines can be pre-charged by a pre-charge clock signal, such that they are periodically coupled to a positive supply voltage rail. Upon being pre-charged, the selected bit line activates a switch that couples a control node to a negative supply voltage rail. A logic state of the control node can be inverted at the output of the column multiplexer to represent the data that is stored in the given accessed memory cell. Thus, the output of the column multiplexer can have a default logic high value.

Upon the associated memory cell having a logic low value, the bit line logic state can decay from a pre-charged logic high state to a logic low state, thus decoupling the control node from the negative voltage supply rail and substantially concurrently activating a switch to couple the control node to the positive supply voltage rail. Accordingly, the output of the column multiplexer is switched to a corresponding logic low state. In addition, the column multiplexer can be configured to latch the data output using only a few additional switches.

Figures 1, 3:
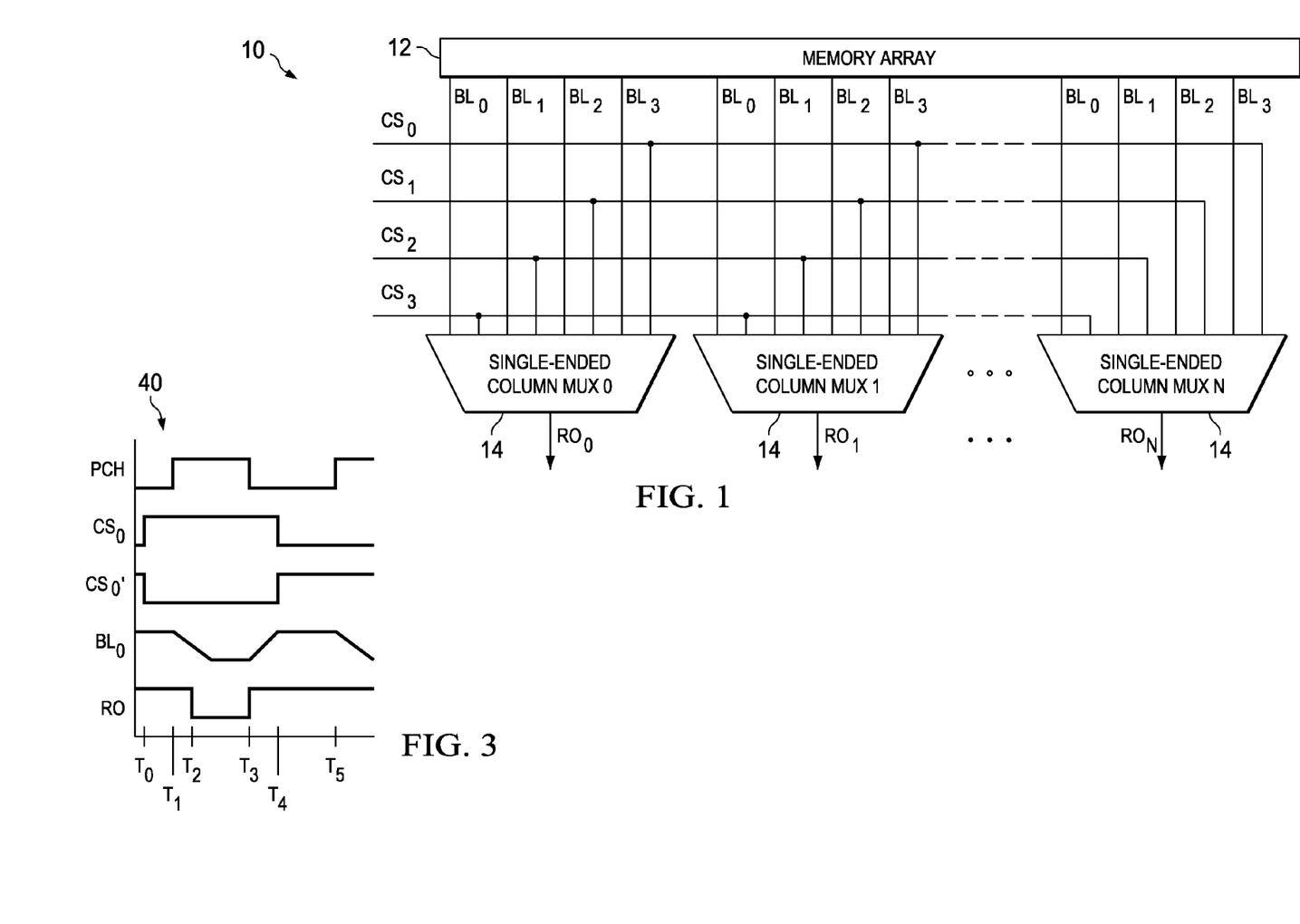
FIG. 1 illustrates an example of a memory read system in accordance with an aspect of the invention.
FIG. 3 illustrates an example of a timing diagram associated with the column multiplexer of the example of FIG. 2 in accordance with an aspect of the invention.

FIG. 1 illustrates an example of a memory read system 10 in accordance with an aspect of the invention. The memory read system 10 can be a portion of a static random access memory (SRAM). The memory read system 10 includes a memory array 12 having a plurality of individually addressable memory cells. For example, the memory array 12 could be organized into memory rows and memory columns, such that peripheral circuitry (not shown) can be, used to access a given memory row for read/write access. The memory read system 10 also includes a plurality of column multiplexers 14, demonstrated in the example of FIG. 1 as numbering from 0 to N, where N is a positive integer.

The memory array 12 is coupled to each of the column multiplexers 14 via a plurality of bit lines BL. In the example of FIG. 1, each of the column multiplexers 14 receives bit line signals on four respective bit lines BL, numbered from $BL_0$ to $BL_3$. The bit lines BL each correspond to a memory column in the memory array 12 for each of the column multiplexers 14. For example, for a total of sixteen column multiplexers 14 (i.e., N=15), the memory array 12 could include 64 columns. As such, each of the four bit lines BL could correspond to a separate data word (i.e., 16 bits) for a given accessed memory row. For example, the bit line $BL_0$ in each of the column multiplexers 12 could correspond to a first data word in a given memory row, the bit line $BL_1$ in each of the column multiplexers 14 could correspond to a second data word in the given memory row, the bit line $BL_2$ in each of the column multiplexers 14 could correspond to a third data word in the given memory row, and the bit line $BL_3$ in each of the column multiplexers 14 could correspond to a fourth data word in the given memory row. It is to be understood, however, that the column multiplexers 14 are not limited to four separate bit lines BL, but that more or less bit lines can be implemented in the memory read system 10 in the example of FIG. 1. It is also to be understood that, in the discussion herein, the term "bit line" and "bit line signal" may be used synonymously, such that "bit line signal $BL_0$" can be used to refer to the data signal that is present on the bit line $BL_0$.

In the example of FIG. 1, the column multiplexers 14 each receive four column select signals CS, labeled in the example of FIG. 1 as $CS_0$ through $CS_3$. The column select signals CS can be mutually exclusively asserted to select an associated one of the bit lines BL in each of the column multiplexers 14. The data in the given memory cells on the respective bit lines BL that are selected by the appropriate column select signal CS is output from the respective column multiplexers 14 as a read-out signal RO. The read-out signals RO are numbered in the example of FIG. 1 as $RO_1$ through $RO_N$, thus corresponding to the respective column multiplexers 14. Collectively, the read-out signals RO can be a data element, such as a data word, for which the memory read system 10 was requested to provide from the memory array 12.

The column multiplexers 14 in the example of FIG. 1 can be configured to receive single-ended bit line signals BL from the memory array 12, as will be demonstrated in greater detail in the example of FIG. 2 below. For example, the column multiplexers 14 may be configured such that a logic state of the memory cell can be sensed without receiving both the bit line signal BL and a complement of the bit line signal BL'. In addition, as will also be demonstrated in greater detail in the example of FIG. 2 below, the bit line signals BL are effectively decoupled from the read-out signals RO at the output of the respective column multiplexers 14. As such, the bit lines on which the bit line signals BL reside are not loaded by the output of the column multiplexer 14. Therefore, the performance speed of the memory read system 10 can be increased.

It is to be understood that that the memory read system 10 is not intended to be limited by the example of FIG. 1. For example, other types of memory access configurations can be implemented in the memory read system 10. As an example, the column select signals can be encoded prior to being input to the column multiplexers 14. In addition, other associated memory devices, including additional memory arrays 12, can be included in the memory read system 10.

Figure 2:
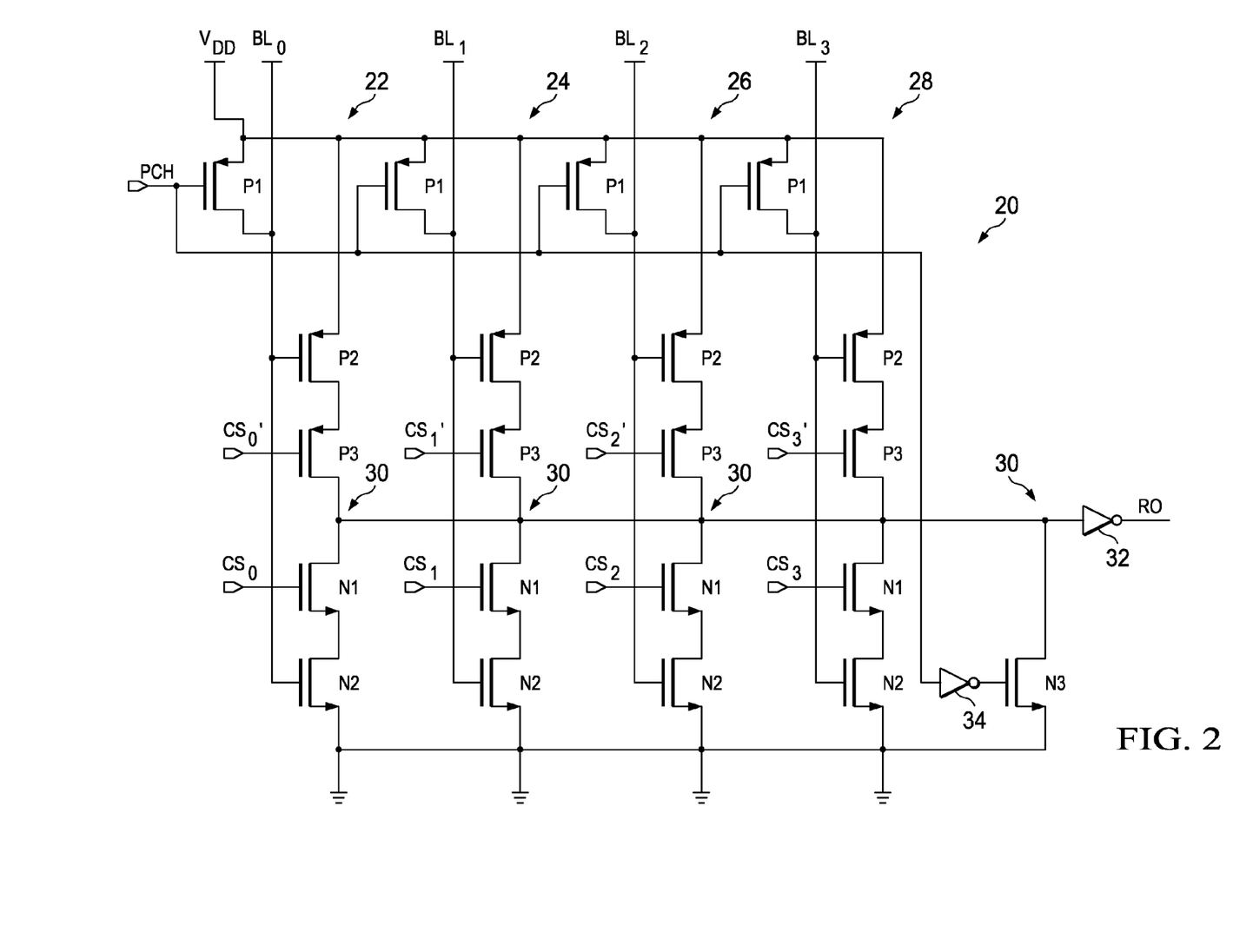
FIG. 2 illustrates an example of a column multiplexer in accordance with an aspect of the invention.

FIG. 2 illustrates an example of a column multiplexer 20 in accordance with an aspect of the invention. The column multiplexer 20 can represent one of the column multiplexers 14 in the example of FIG. 1. As such, reference will be made to the example of FIG. 1 in the discussion of the example of FIG. 2. The column multiplexer 20 includes four column elements 22, 24, 26, and 28. Each of the column elements 22, 24, 26, and 28 corresponds to a respective one of the bit lines $BL_0$, $BL_1$, $BL_2$, and $BL_3$, and thus to a respective different column of the memory array 12 in the example of FIG. 1. As described above in the example of FIG. 1, and as described in greater detail below, the columns corresponding to the bit lines $BL_0$, $BL_1$, $BL_2$, and $BL_3$ are selected by column select signals $CS_0$, $CS_1$, $CS_2$, and $CS_3$, respectively. The following discussion in the example of FIG. 2 is directed to the operation of the column element 22. However, it is to be understood that the operation is substantially the same for all of the column elements 22, 24, 26, and 28. As such, like identifiers are used in the example of FIG. 2 in all of the column elements 22, 24, 26, and 28.

The column element 22 includes a P-type field effect transistor (FET) P1. The P-FET P1 is configured to couple the bit line $BL_0$ to a positive supply voltage rail, illustrated in the example of FIG. 2 as $V_{DD}$. In the example of FIG. 2, the P-FET P1 has a gate terminal that is coupled to a pre-charge clock signal PCH. The pre-charge clock signal PCH can be derived from a system clock, can be a delayed version of a system clock, or can be a separately generated clock signal. As such, the P-FET P1 becomes activated substantially upon a falling edge of the pre-charge clock signal PCH.

The column element 22 also includes a P-FET P2, a P-FET P3, an N-type N1, and an N-FET N2. The P-FET P2 and the N-FET N2 each have a gate terminal that is coupled to the bit line $BL_0$. The P-FET P2 has a source terminal that is coupled to the positive supply voltage rail $V_{DD}$, and the N-FET N2 has a source terminal that is coupled to a negative supply voltage rail, illustrated in the example of FIG. 2 as ground. The N-FET N1 is interconnected between the N-FET N2 and a control node 30 and has a gate terminal that is coupled to the column select signal $CS_0$. The P-FET P3 is interconnected between the P-FET P2 and the control node 30 and has a gate terminal that is coupled to a complement of the column select signal $CS_0'$. It is to be understood that the complement column select signal $CS_0'$ can be generated from an inverter (not shown) in the column multiplexer 20, or can be separately input to the column multiplexer 20. The column multiplexer 20 also includes an inverter 32 that inverts the logic state of the control node 30 and outputs a read-out signal RO at the output of the column multiplexer.

Upon the column select signal $CS_0$ being asserted (i.e., logic high), both the N-FET N1 and the P-FET P3 become activated. Therefore, the control node 30 is switched to either the positive supply voltage rail $V_{DD}$ or ground depending on the logic state of the bit line $BL_0$. Thus, upon the logic state of the bit line $BL_0$ being logic high, the control node 30 is switched to a logic low state as it is sunk to ground through the N-FETs N1 and N2. Therefore, the read-out signal RO can have a logic high state, such that it corresponds to the data on the bit line $BL_0$. Alternatively, upon the logic state of the bit line $BL_0$ being logic low, the control node 30 is switched to a logic high state as it is pulled-up to the positive supply voltage rail $V_{DD}$ through the P-FETs P3 and P2. Therefore, the read-out signal RO can have a logic low state, such that it corresponds to the data on the bit line $BL_0$.

As will be demonstrated in greater detail below in the example of FIG. 3, the pre-charge clock signal PCH is configured to periodically pre-charge the bit line $BL_0$ by coupling the bit line $BL_0$ to the positive supply voltage rail $V_{DD}$. As such, the N-FET N2 is initially activated upon the pre-charge clock signal PCH being logic low, thus sinking the control node 30 to ground. Upon the pre-charge clock signal PCH switching to a logic high state, the bit line $BL_0$ can remain logic high, indicating that the corresponding memory cell stores logic 1 data. Accordingly, the read-out signal RO remains at a logic high state to indicate a memory read of logic 1 from the accessed memory cell. Alternatively, the bit line $BL_0$ can decay from the pre-charged logic high state to a logic low state, indicating that the corresponding memory cell stores logic 0 data. As such, the N-FET N2 deactivates at a time when the voltage potential of the bit line $BL_0$ decreases below a threshold voltage of the N-FET N2. At a time that is substantially concurrent with the deactivation of the N-FET N2, the voltage potential of the bit line $BL_0$ decreases to an activation voltage of the P-FET P2, thus switching the control node 30 to the positive supply voltage rail $V_{DD}$. Accordingly, the read-out signal RO switches to a logic low state to indicate a memory read of logic 0 from the accessed memory cell.

As described above, in the example of FIG. 2, the operation of each of the column elements 24, 26, and 28 is substantially the same as that described for the operation of the column element 22. Therefore, regarding the column element 24, upon the column select signal $CS_1$ being asserted, the bit line $BL_1$ can switch the control node 30 for a memory read from the accessed memory cell corresponding to the data on the bit line $BL_1$, similar to that described above regarding the column element 22. Likewise, regarding the column element 26, upon the column select signal $CS_2$ being asserted, the bit line $BL_2$ can switch the control node 30 for a memory read from the accessed memory cell corresponding to the data on the bit line $BL_2$. In addition, regarding the column element 28, upon the column select signal $CS_3$ being asserted, the bit line $BL_3$ can switch the control node 30 for a memory read from the accessed memory cell corresponding to the data on the bit line $BL_3$. It is to be understood that, in the example of FIG. 2, because each of the bit lines $BL_0$, $BL_1$, $BL_2$, and $BL_3$ can be a portion of a distinct data element (i.e., data word), the assertion of the respective column select signals $CS_0$, $CS_1$, $CS_2$, and $CS_3$ can be mutually exclusive to correspond to a memory read operation of the respective one of the different data elements. As such, in the example of FIG. 2, the logic state of the read-out signal RO can represent a memory read from one accessed memory cell at a time.

The column multiplexer 20 also includes an inverter 34 that receives the pre-charge clock signal PCH as an input and has an output coupled to a gate terminal of an N-FET N3. The N-FET N3 is interconnected between the control node 30 and ground. As such, the inverter 34 and the N-FET N3 can provide a rapid reset of the control node 30 upon a falling edge of the pre-charge clock signal PCH. As such, upon a given one of the memory cells corresponding to a respective one of the bit lines $BL_0$, $BL_1$, $BL_2$, and $BL_3$ having logic 0 data, the transition of the read-out signal RO from a logic low state to a logic high state is not dependent on a rate of increase of the voltage potential of the respective one of the bit lines $BL_0$, $BL_1$, $BL_2$, and $BL_3$ as it is pre-charged back to a logic high state.

In the example of FIG. 2, the column multiplexer 20 is configured to sense single-ended bit lines $BL_0$, $BL_1$, $BL_2$, and $BL_3$, as opposed to both the bit lines $BL_0$, $BL_1$, $BL_2$, and $BL_3$ and their respective complements. In addition, the reading of data from the respective bit lines $BL_0$, $BL_1$, $BL_2$, and $BL_3$ and the multiplexing of the data from the bit lines $BL_0$, $BL_1$, $BL_2$, and $BL_3$ to the output of the column multiplexer 20 is merged together in the column multiplexer 20. For these reasons, the column multiplexer 20 can be configured in a reduced circuitry overhead package. Furthermore, because the pre-charge clock signal PCH couples the bit line $BL_0$ to the positive supply voltage rail $V_{DD}$, the read-out signal RO has a default logic high state to favor the reading of substantive data, with the reading of a logic low state being at least as fast. In addition, the bit lines $BL_0$, $BL_1$, $BL_2$, and $BL_3$ are decoupled from the control node 30 via the gate terminals of the N-FETs N2 and the P-FETs P2, and thus the output of the column multiplexer 20 does not load the bit lines $BL_0$, $BL_1$, $BL_2$, and $BL_3$. For these reasons, the column multiplexer 20 is optimized to perform high speed read operations.

It is to be understood that that the column multiplexer 20 is not intended to be limited by the example of FIG. 2. For example, additional switches and/or gates, as well as other memory sensing configurations, can be implemented in the column multiplexer 20. As an example, the transistors implemented in the example of FIG. 2 are not limited to being FETs, but could be any of a variety of other switches.

FIG. 3 illustrates an example of a timing diagram 40 associated with the column multiplexer 20 in the example of FIG. 2 in accordance with an aspect of the invention. As the timing diagram 40 is associated with the column multiplexer 20 in the example of FIG. 2, reference will be made to the example of FIG. 2 in the discussion of the example of FIG. 3. In addition, the discussion of the timing diagram 40 in the example of FIG. 3 is with reference to the column element 22 in the example of FIG. 2. However, it is to be understood that the timing diagram 40 can be equally applicable to the other column elements 24, 26, and 28, as well. In addition, the timing diagram 40 is demonstrated in the example of FIG. 3 to be an ideal timing diagram. However, it is also to be understood that there are inherent switching and/or other delays in the column multiplexer 20 that are not represented in the timing diagram 40.

In the example of FIG. 3, a memory cell corresponding to the bit line $BL_0$ stores logic 0 data. At a time $T_0$, the column select signal $CS_0$ is asserted from a logic low state to a logic high state. Likewise, the complement of the column select signal $CS_0'$ switches from a logic high state to a logic low state. Accordingly, the memory cell corresponding to the bit line $BL_0$ is selected for a read operation. At a time prior to $T_0$, the pre-charge clock signal PCH was switched to a logic low state. As such, the bit line $BL_0$ is pre-charged to a logic high state due to the coupling of the bit line $BL_0$ to the positive supply voltage rail $V_{DD}$ via the P-FET P1. Therefore, the control node 30 is sunk to ground via the N-FETs N1 and N2, as well as the inverter 34 and the N-FET N3, resulting in a logic high state for the read-out signal RO.

At a time $T_1$, the pre-charge clock signal PCH switches to a logic high state. As such, the P-FET P1 deactivates and decouples the bit line $BL_0$ from the positive supply voltage rail $V_{DD}$. Also due to the logic high state of the pre-charge clock signal PCH at the time $T_1$, the N-FET N3 deactivates. As the bit line $BL_0$ remains at a pre-charged logic high state at the time $T_1$, the control node 30 remains sunk to ground via the N-FETs N1 and N2. However, at the time $T_1$, because of the decoupling of the bit line $BL_0$ from the positive supply voltage rail $V_{DD}$, the logic 0 data stored in the memory cell to which the bit line $BL_0$ corresponds begins to decay the bit line $BL_0$ from the pre-charged logic high state to a logic low state. As such, the voltage potential of the bit line $BL_0$ begins to decrease.

At a time $T_2$, the voltage potential of the bit line $BL_0$ decreases below the threshold voltage of the N-FET N2, thus deactivating the N-FET N2. At approximately the same time, the voltage potential of the bit line $BL_0$ decreases to an activation voltage of the P-FET P2, thus activating the P-FET P2. Therefore, the control node 30 switches from being coupled to ground to being coupled to the positive supply voltage rail $V_{DD}$. Thus, at the time $T_2$, the read-out signal RO switches to a logic low state, and is thus representative of the logic 0 data in the memory cell for an appropriate multiplexed output in the read operation.

At a time $T_3$, the pre-charge clock signal PCH is switched to a logic low state. Thus, at the time $T_3$, the bit line $BL_0$ is once again coupled to the positive supply voltage rail $V_{DD}$ via the P-FET P1. Accordingly, the bit line $BL_0$ begins to ramp backup from a logic low state to a pre-charged logic high state. In addition, the output of the inverter 34 switches logic high and activates the N-FET N3, thus sinking the control node 30 to ground. Accordingly, the read-out signal RO switches to a logic high state at the time $T_3$ resulting from the rapid reset operation of the inverter 34 and the N-FET N3, as described above in the example of FIG. 2.

At a time $T_4$, the bit line $BL_0$ has achieved a fully pre-charged logic high state. It is to be understood that, absent the rapid reset operation of the inverter 34 and the N-FET N3, the read-out signal RO would not receive a logic low to logic high transition until sometime between the time $T_3$ and the time $T_4$ based on the opposite switching of the P-FET P2 and the N-FET N2 resulting from the ramping voltage potential of the bit line $BL_0$. Also at the time $T_4$, the column select signal $CS_0$ is de-asserted, thus signaling the end of the read operation of the memory cell for which the bit line $BL_0$ corresponds. It is to be understood that, although illustrated as occurring concurrently at the time $T_4$, the switching of the column select signal $CS_0$ and the bit line $BL_0$ achieving a fully pre-charged logic high state may be unrelated events. As such, they may not necessarily occur at substantially the same time.

At a time $T_5$, the pre-charge clock signal PCH is once again switched to a logic high state. Thus, at the time $T_5$, another read operation of a different memory cell could occur, for example, for the memory cell corresponding to any one of the bit lines $BL_1$, $BL_2$, and $BL_3$. For example, a read operation could occur for a different one of the bit lines $BL_0$, $BL_1$, $BL_2$, and $BL_3$ at each period of the pre-charge clock signal PCH.

Figure 4:
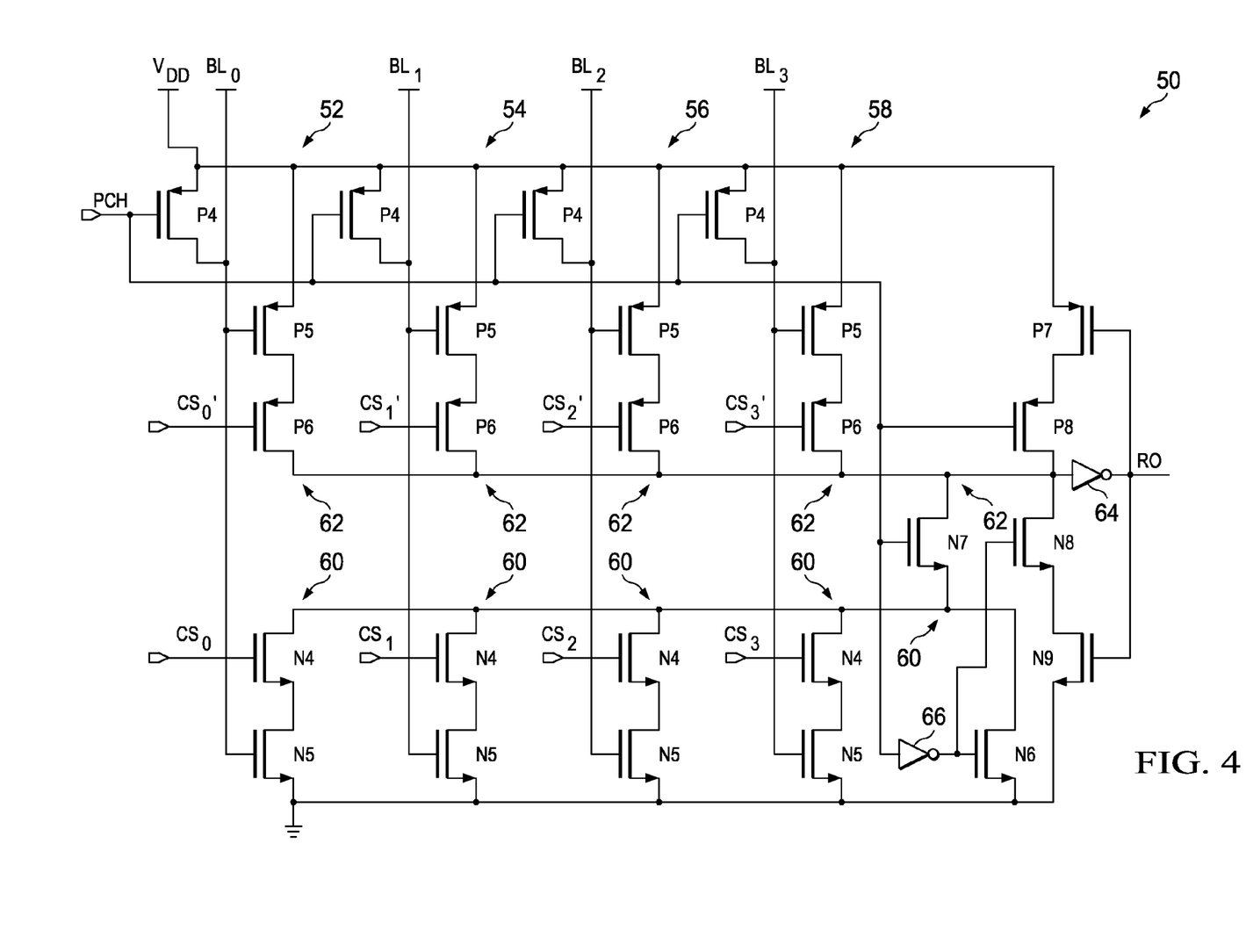
FIG. 4 illustrates another example of a column multiplexer in accordance with an aspect of the invention.

FIG. 4 illustrates another example of a column multiplexer 50 in accordance with an aspect of the invention. Similar to the example of FIG. 2 above, the column multiplexer 50 can represent one of the column multiplexers 14 in the example of FIG. 1. As such, reference will be made to the example of FIG. 1 in the discussion of the example of FIG. 4. However, as will be described in greater detail below, the column multiplexer 50 can be configured to combine data reading, multiplexing, and output data latching operations into the column multiplexer 50.

The column multiplexer 50 includes four column elements 52, 54, 56, and 58. Each of the column elements 52, 54, 56, and 58 corresponds to a respective one of the bit lines $BL_0$, $BL_1$, $BL_2$, and $BL_3$, and thus to a respective different column of the memory array 12 in the example of FIG. 1. Similar to that described above in the example of FIG. 2, the columns corresponding to the bit lines $BL_0$, $BL_1$, $BL_2$, and $BL_3$ are selected by column select signals $CS_0$, $CS_1$, $CS_2$, and $CS_3$, respectively. The following discussion in the example of FIG. 4 is directed to the operation of the column element 52. However, it is to be understood that the operation can be substantially the same for each of the column elements 52, 54, 56, and 58. As such, like identifiers are used in the example of FIG. 4 in all of the column elements 52, 54, 56, and 58.

The column element 52 includes a P-FET P4. The P-FET P4 is configured to couple the bit line $BL_0$ to a positive supply voltage rail, illustrated in the example of FIG. 4 as $V_{DD}$. In the example of FIG. 4, the P-FET P4 has a gate terminal that is coupled to a pre-charge clock signal PCH. The pre-charge clock signal PCH can be derived from a system clock, can be a delayed version of a system clock, or can be a separately generated clock signal. As such, the P-FET P4 becomes activated substantially upon a falling edge of the pre-charge clock signal PCH.

The column element 52 also includes a P-FET P5, a P-FET P6, an N-type N4, and an N-FET N5. The P-FET P5 and the N-FET N5 each have a gate terminal that is coupled to the bit line $BL_0$. The P-FET P5 has a source terminal that is coupled to the positive supply voltage rail $V_{DD}$, and the N-FET N5 has a source terminal that is coupled to a negative supply voltage rail, illustrated in the example of FIG. 4 as ground. The N-FET N4 is interconnected between the N-FET N5 and a control node 60 and has a gate terminal that is coupled to the column select signal $CS_0$. The P-FET P6 is interconnected between the P-FET P5 and a control node 62 and has a gate terminal that is coupled to a complement of the column select signal $CS_0'$. It is to be understood that the complement column select signal $CS_0'$ can be generated from an inverter (not shown) in the column multiplexer 50, or can be separately input to the column multiplexer 50. The column multiplexer 50 also includes an inverter 64 that inverts the logic state of the control node 62 and outputs a read-out signal RO at the output of the column multiplexer.

Upon the column select signal $CS_0$ being asserted (i.e., logic high), both the N-FET N4 and the P-FET P6 become activated. Therefore, the control node 60 can be switched to ground or the control node 62 can be switched to the positive supply voltage rail $V_{DD}$ depending on the logic state of the bit line $BL_0$. Thus, upon the logic state of the bit line $BL_0$ being logic high, the control node 60 is switched to a logic low state as it is sunk to ground through the N-FETs N4 and N5. Thus, as will be described in greater detail below, the control node 62 can be switched to a logic low state by being coupled to the control node 60. Likewise, upon the logic state of the bit line $BL_0$ being logic low, the control node 62 is switched to a logic high state as it is pulled-up to the positive supply voltage rail $V_{DD}$ through the P-FETs P6 and P5.

Similar to the example of FIG. 2, the pre-charge clock signal PCH is configured to periodically pre-charge the bit line $BL_0$ by coupling the bit line $BL_0$ to the positive supply voltage rail $V_{DD}$. As such, the N-FET N5 is initially activated upon the pre-charge clock signal PCH being logic low, thus sinking the control node 60 to ground. Upon the pre-charge clock signal PCH switching to a logic high state, the bit line $BL_0$ can remain logic high, indicating that the corresponding memory cell stores logic 1 data. Accordingly, the read-out signal RO is latched to a logic high state to indicate a memory read of logic 1 from the accessed memory cell, as will be explained in greater detail below. Alternatively, the bit line $BL_0$ can decay from the pre-charged logic high state to a logic low state, indicating that the corresponding memory cell stores logic 0 data. As such, the N-FET N5 deactivates at a time when the voltage potential of the bit line $BL_0$ decreases below a threshold voltage of the N-FET N5. At a time that is substantially concurrent with the deactivation of the N-FET N5, the voltage potential of the bit line $BL_0$ decreases to an activation voltage of the P-FET P5, thus switching the control node 62 to the positive supply voltage rail $V_{DD}$. Accordingly, the read-out signal RO is latched to a logic low state to indicate a memory read of logic 0 from the accessed memory cell, as will be explained in greater detail below.

As described above, in the example of FIG. 4, the operation of each of the column elements 54, 56, and 58 can be substantially the same as that described for the operation of the column element 52. Therefore, regarding the column element 54, upon the column select signal $CS_1$ being asserted, the bit line $BL_1$ can switch the control node 62 for a memory read from the accessed memory cell corresponding to the data on the bit line $BL_1$, similar to that described above regarding the column element 52. Likewise, regarding the column element 56, upon the column select signal $CS_2$ being asserted, the bit line $BL_2$ can switch the control node 62 for a memory read from the accessed memory cell corresponding to the data on the bit line $BL_2$. In addition, regarding the column element 58, upon the column select signal $CS_3$ being asserted, the bit line $BL_3$ can switch the control node 62 for a memory read from the accessed memory cell corresponding to the data on the bit line $BL_3$. It is to be understood that, in the example of FIG. 4, because each of the bit lines $BL_0$, $BL_1$, $BL_2$, and $BL_3$ can be a portion of a distinct data element (i.e., data word), the assertion of the respective column select signals $CS_0$, $CS_1$, $CS_2$, and $CS_3$ can be mutually exclusive to correspond to a memory read operation of the respective one of the different data elements. As such, in the example of FIG. 4, the logic state of the read-out signal RO can represent a memory read from one accessed memory cell at a time.

The column multiplexer 50 also includes an inverter 66 that receives the pre-charge clock signal PCH as an input and has an output coupled to a gate terminal of an N-FET N6. The N-FET N6 is interconnected between the control node 60 and ground. Similar to that described above regarding the example of FIG. 2, the inverter 66 and the N-FET N6 provide a rapid reset of the control node 60 upon a falling edge of the pre-charge clock signal PCH.

In addition, the column multiplexer 50 includes an N-FET N7, an N-FET N8, an N-FET N9, a P-FET P7, and a P-FET P8. The N-FET N7 is interconnected between the control node 60 and the control node 62 and has a gate terminal coupled to the pre-charge clock signal PCH. The P-FETs P7 and P8 are interconnected between the positive supply voltage rail $V_{DD}$ and the control node 62, with the P-FET P7 having a gate terminal coupled to the read-out signal RO and the P-FET P8 having a gate terminal coupled to the pre-charge clock signal PCH. The N-FETs N8 and N9 are interconnected between ground and the control node 62, with the N-FET N9 having a gate terminal coupled to the read-out signal RO and the N-FET N8 having a gate terminal coupled to the output of the inverter 66, such that it receives the complement of the pre-charge clock signal PCH. The transistors N7, N8, N9, P7, and P8 are collectively configured to latch the data of the read-out signal RO at the falling edge of the pre-charge clock signal PCH.

As an example, similar to that described above for the example of FIG. 2, the inverter 66 and the N-FET N6 provide a rapid reset of the control node 60 upon a falling edge of the pre-charge clock signal PCH. However, the N-FET N7 isolates the control node 60 from the control node 62, so as to prevent a rapid reset of latched logic 1 data. Concurrently during a logic low portion of the period of the pre-charge clock signal PCH, both the P-FET P8 and the N-FET N8 are activated. Thus, the control node 62 is either coupled to the positive supply voltage rail $V_{DD}$ via the P-FET P7 or to ground via the N-FET N9, depending on the logic state of the read-out signal RO. For example, upon the read-out signal RO being logic high, the N-FET N9 is activated to sink the control node 62 to ground, thus latching the logic high state of the read-out signal RO via the inverter 64. As another example, upon the read-out signal RO being logic low, the P-FET P7 is activated to pull-up the control node 62 to the positive supply voltage rail $V_{DD}$, thus latching the logic low state of the read-out signal RO via the inverter 64.

Upon a transition of the pre-charge clock signal PCH from logic low to logic high, the latching caused by the transistors P7, P8, N8, and N9 is disabled. Likewise, the N-FET N6 is deactivated. However, as the respective one of the bit lines $BL_0$, $BL_1$, $BL_2$, and $BL_3$ is no longer coupled to the positive supply voltage rail $V_{DD}$ via the P-FET P4, the respective one of the bit lines $BL_0$, $BL_1$, $BL_2$, and $BL_3$ either remains logic high or decays to a logic low state, as described above. Thus, the N-FET N5 remains activated at the rising edge of the pre-charge clock signal PCH, at least temporarily, to couple the control node 60 to ground. In addition, the N-FET N7 switches the control node 60 to the control node 62. As such, regardless of the initial latched state of the control node 62, the control node 62 is switched to a logic low state at a rising edge of the pre-charge clock signal PCH. Upon the data represented in the respective one of the bit lines $BL_0$, $BL_1$, $BL_2$, and $BL_3$ being logic 1, the control node 62 remains coupled to ground via the N-FET N7, the N-FET N4, and the N-FET N5. The read-out signal RO thus becomes latched to a logic high state at the falling edge of the pre-charge clock signal PCH. However, upon the data represented in the respective one of the bit lines $BL_0$, $BL_1$, $BL_2$, and $BL_3$ being logic 0, the voltage potential of the respective bit line decays to a logic low state and the control node 62 becomes coupled to the positive supply voltage rail $V_{DD}$. The read-out signal RO thus becomes latched to a logic low state at the falling edge of the pre-charge clock signal PCH.

Similar to that described above in the example of FIG. 2, the column multiplexer 50 is configured to perform high speed read operations and can be configured with reduced circuitry overhead. Furthermore, with the addition of only five transistors, the column multiplexer 50 is also configured to latch the multiplexed output data, such that an additional external latch may not be necessary to latch the output signal of the column multiplexer 50.

It is to be understood that that the column multiplexer 50 is not intended to be limited by the example of FIG. 4. For example, additional switches and/or gates, as well as other memory sensing configurations, can be implemented in the column multiplexer 50. As an example, the transistors implemented in the example of FIG. 4 are not limited to being FETs, but could be any of a variety of other switches.

FIGS. 5-8 illustrate examples of timing diagrams associated with the column multiplexer 50 in the example of FIG. 4. As the timing diagrams in the examples of FIGS. 5-8 are associated with the column multiplexer 50 in the example of FIG. 4, reference will be made to the example of FIG. 4 in the discussion of the examples of FIGS. 5-8. In addition, the discussion of the timing diagrams in the examples of FIGS. 5-8 is with reference to the column element 52 in the example of FIG. 4. However, it is to be understood that the timing diagrams in the examples of FIGS. 5-8 can be equally applicable to the other column elements 54, 56, and 58, as well. In addition, the timing diagrams in the examples of FIGS. 5-8 are demonstrated as ideal timing diagrams. However, it is also to be understood that there are inherent switching and/or other delays in the column multiplexer 50 that are not represented in the timing diagrams in the examples of FIGS. 5-8.

Figure 5:
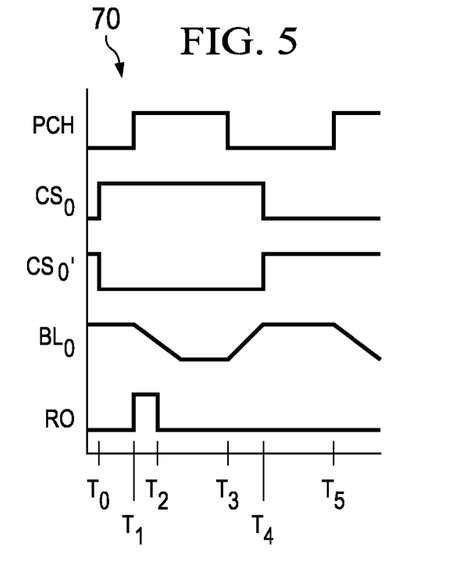
FIG. 5 illustrates an example of a timing diagram associated with the column multiplexer of the example of FIG. 4 in accordance with an aspect of the invention.

FIG. 5 illustrates an example of a timing diagram 70 associated with the column multiplexer 50 in the example of FIG. 4 in accordance with an aspect of the invention. In the example of FIG. 5, a memory cell corresponding to the bit line $BL_0$ stores logic 0 data, and the previous latched data of the read-out signal RO is logic 0.

At a time $T_0$, the column select signal $CS_0$ is asserted from a logic low state to a logic high state. Likewise, the complement of the column select signal $CS_0'$ switches from a logic high state to a logic low state. Accordingly, the memory cell corresponding to the bit line $BL_0$ is selected for a read operation. At a time prior to $T_0$, the pre-charge clock signal PCH was switched to a logic low state. As such, the bit line $BL_0$ is pre-charged to a logic high state due to the coupling of the bit line $BL_0$ to the positive supply voltage rail $V_{DD}$ via the P-FET P4. Therefore, the control node 60 is sunk to ground via the N-FETs N4 and N5, as well as the inverter 66 and the N-FET N6. In addition, both the P-FET P7 and the P-FET P8 are activated prior to the time $T_0$ to couple the control node 62 to the positive supply voltage rail $V_{DD}$, thus maintaining latched logic 0 data of the read-out signal RO.

At a time $T_1$, the pre-charge clock signal PCH switches to a logic high state. As Such, the P-FET P4 deactivates and decouples the bit line $BL_0$ from the positive supply voltage rail $V_{DD}$. Also due to the logic high state of the pre-charge clock signal PCH at the time $T_1$, the N-FET N6, the N-FET N8, and the P-FET P8 all deactivate, and the N-FET N7 activates. As the bit line $BL_0$ remains at a pre-charged logic high state at the time $T_1$, the control node 60 remains sunk to ground via the N-FETs N4 and N5. Therefore, the control node 62 is switched to the logic low state of the control node 60, and the read-out signal RO switches to a logic high state. However, at the time $T_1$, because of the decoupling of the bit line $BL_0$ from the positive supply voltage rail $V_{DD}$, the logic 0 data stored in the memory cell to which the bit line $BL_0$ corresponds begins to decay the bit line $BL_0$ from the pre-charged logic high state to a logic low state. As such, the voltage potential of the bit line $BL_0$ begins to decrease.

At a time $T_2$, the voltage potential of the bit line $BL_0$ decreases below the threshold voltage of the N-FET N5, thus deactivating the N-FET N5. At approximately the same time, the voltage potential of the bit line $BL_0$ decreases to an activation voltage of the P-FET P5, thus activating the P-FET P5. Therefore, the control node 60 becomes decoupled from ground and the control node 62 becomes coupled to the positive supply voltage rail $V_{DD}$. Thus, at the time $T_2$, the read-out signal RO switches to a logic low state, and is thus representative of the logic 0 data in the memory cell for an appropriate multiplexed output in the read operation. The logic low state of the read-out signal RO activates the P-FET P7.

At a time $T_3$, the pre-charge clock signal PCH is switched to a logic low state. Thus, at the time $T_3$, the bit line $BL_0$ is once again coupled to the positive supply voltage rail $V_{DD}$ via the P-FET P4 and the N-FET N7 deactivates. Accordingly, the bit line $BL_0$ begins to ramp back up from a logic low state to a pre-charged logic high state. In addition, both the P-FET P8 and the N-FET N8 become activated. Because the P-FET P7 was already activated at approximately the time $T_2$, the control node 62 becomes coupled to the positive supply voltage rail $V_{DD}$ via the P-FETs P7 and P8. Therefore, the logic 0 data of the read-out signal RO becomes latched at the falling edge of the pre-charge clock signal PCH, at the time $T_3$. In addition, the output of the inverter 66 switches logic high and activates the N-FET N6, thus sinking the control node 60 to ground. Accordingly, the control node 60 is rapidly reset, but the deactivated N-FET N7 isolates the logic low state of the control node 60 from the logic high state of the control node 62.

At a time $T_4$, the bit line $BL_0$ has achieved a fully pre-charged logic high state. It is to be understood that, absent the rapid reset operation of the inverter 66 and the N-FET N6, the control node 60 would have a floating voltage potential until sometime between the time $T_3$ and the time $T_4$ based on the activation of the N-FET N5 resulting from the ramping voltage potential of the bit line $BL_0$. Also at the time $T_4$, the column select signal $CS_0$ is de-asserted, thus signaling the end of the read operation of the memory cell for which the bit line $BL_0$ corresponds. It is to be understood that, although illustrated as occurring concurrently at the time $T_4$, the switching of the column select signal $CS_0$ and the bit line $BL_0$ achieving a fully pre-charged logic high state may be unrelated events. As such, they may not necessarily occur at substantially the same time.

At a time $T_5$, the pre-charge clock signal PCH is once again switched to a logic high state. Thus, at the time $T_5$, another read operation of a different memory cell could occur, for example, for the memory cell corresponding to any one of the bit lines $BL_1$, $BL_2$, and $BL_3$. For example, a read operation could occur for a different one of the bit lines $BL_0$, $BL_1$, $BL_2$, and $BL_3$ at each period of the pre-charge clock signal PCH.

Figure 6:
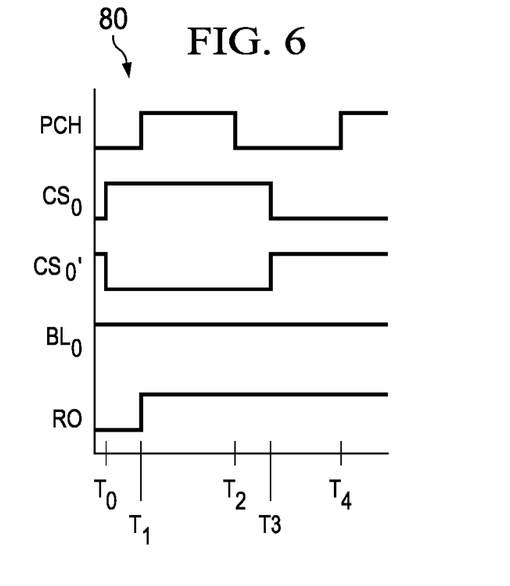
FIG. 6 illustrates another example of a timing diagram associated with the column multiplexer of the example of FIG. 4 in accordance with an aspect of the invention.

FIG. 6 illustrates another example of a timing diagram 80 associated with the column multiplexer 50 in the example of FIG. 4 in accordance with an aspect of the invention. In the example of FIG. 6, a memory cell corresponding to the bit line $BL_0$ stores logic 1 data, and the previous latched data of the read-out signal RO is logic 0.

At a time $T_0$, the column select signal $CS_0$ is asserted from a logic low state to a logic high state. Likewise, the complement of the column select signal $CS_0'$ switches from a logic high state to a logic low state. Accordingly, the memory cell corresponding to the bit line $BL_0$ is selected for a read operation. At a time prior to $T_0$, the pre-charge clock signal PCH was switched to a logic low state. As such, the bit line $BL_0$ is pre-charged to a logic high state due to the coupling of the bit line $BL_0$ to the positive supply voltage rail $V_{DD}$ via the P-FET P4. Therefore, the control node 60 is sunk to ground via the N-FETs N4 and N5, as well as the inverter 66 and the N-FET N6. In addition, both the P-FET P7 and the P-FET P8 are activated prior to the time $T_0$ to couple the control node 62 to the positive supply voltage rail $V_{DD}$, thus maintaining latched logic 0 data of the read-out signal RO.

At a time $T_1$, the pre-charge clock signal PCH switches to a logic high state. As such, the P-FET P4 deactivates and decouples the bit line $BL_0$ from the positive supply voltage rail $V_{DD}$. Also due to the logic high state of the pre-charge clock signal PCH at the time $T_1$, the N-FET N6, the N-FET N8, and the P-FET P8 all deactivate, and the N-FET N7 activates. As the bit line $BL_0$ remains at a logic high state at the time $T_1$, despite the decoupling of the bit line $BL_0$ from the positive supply voltage rail $V_{DD}$, the control node 60 remains sunk to ground via the N-FETs N4 and N5. Therefore, the control node 62 is switched to the logic low state of the control node 60, and the read-out signal RO switches to a logic high state. In addition, the logic high state of the read-out signal RO activates the N-FET N9. As the voltage potential of the bit line $BL_0$ does not decay, the logic state of the control node 62, and thus the read-out signal RO, remains steady.

At a time $T_2$, the pre-charge clock signal PCH is switched to a logic low state. Thus, at the time $T_2$, the bit line $BL_0$ is once again coupled to the positive supply voltage rail $V_{DD}$ via the P-FET P4 and the N-FET N7 deactivates. In addition, both the P-FET P8 and the N-FET N8 become activated. Because the N-FET N9 was already activated at approximately the time $T_1$, the control node 62 becomes coupled to ground via the N-FETs N8 and N9. Therefore, the logic 1 data of the read-out signal RO becomes latched at the falling edge of the pre-charge clock signal PCH, at the time $T_2$.

At the time $T_3$, the column select signal $CS_0$ is de-asserted, thus signaling the end of the read operation of the memory cell for which the bit line $BL_0$ corresponds. At a time $T_4$, the pre-charge clock signal PCH is once again switched to a logic high state. Thus, at the time $T_4$, another read operation of a different memory cell could occur, for example, for the memory cell corresponding to any one of the bit lines $BL_1$, $BL_2$, and $BL_3$. For example, a read operation could occur for a different one of the bit lines $BL_0$, $BL_1$, $BL_2$, and $BL_3$ at each period of the pre-charge clock signal PCH.

Figure 7:
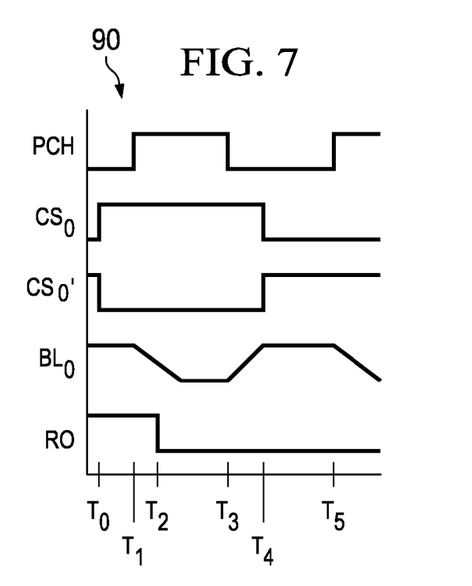
FIG. 7 illustrates another example of a timing diagram associated with the column multiplexer of the example of FIG. 4 in accordance with an aspect of the invention.

FIG. 7 illustrates an example of a timing diagram 90 associated with the column multiplexer 50 in the example of FIG. 4 in accordance with an aspect of the invention. In the example of FIG. 7, a memory cell corresponding to the bit line $BL_0$ stores logic 0 data, and the previous latched data of the read-out signal RO is logic 1.

At a time $T_0$, the column select signal $CS_0$ is asserted from a logic low state to a logic high state. Likewise, the complement of the column select signal $CS_0'$ switches from a logic high state to a logic low state. Accordingly, the memory cell corresponding to the bit line $BL_0$ is selected for a read operation. At a time prior to $T_0$, the pre-charge clock signal PCH was switched to a logic low state. As such, the bit line $BL_0$ is pre-charged to a logic high state due to the coupling of the bit line $BL_0$ to the positive supply voltage rail $V_{DD}$ via the P-FET P4. Therefore, the control node 60 is sunk to ground via the N-FETs N4 and N5, as well as the inverter 66 and the N-FET N6. In addition, both the N-FET N8 and the N-FET N9 are activated prior to the time $T_0$ to couple the control node 62 to ground, thus maintaining latched logic 1 data of the read-out signal RO.

At a time $T_1$, the pre-charge clock signal PCH switches to a logic high state. As such, the P-FET P4 deactivates and decouples the bit line $BL_0$ from the positive supply voltage rail $V_{DD}$. Also due to the logic high state of the pre-charge clock signal PCH at the time $T_1$, the N-FET N6, the N-FET N8, and the P-FET P8 all deactivate, and the N-FET N7 activates. As the bit line $BL_0$ remains at a pre-charged logic high state at the time $T_1$, the control node 60 remains sunk to ground via the N-FETs N4 and N5. Therefore, the control node 62 remains at the logic low state of the control node 60, and the read-out signal RO remains at a logic high state. However, at the time $T_1$, because of the decoupling of the bit line $BL_0$ from the positive supply voltage rail $V_{DD}$, the logic 0 data stored in the memory cell to which the bit line $BL_0$ corresponds begins to decay the bit line $BL_0$ from the pre-charged logic high state to a logic low state. As such, the voltage potential of the bit line $BL_0$ begins to decrease.

At a time $T_2$, the voltage potential of the bit line $BL_0$ decreases below the threshold voltage of the N-FET N5, thus deactivating the N-FET N5. At approximately the same time, the voltage potential of the bit line $BL_0$ decreases to an activation voltage of the P-FET P5, thus activating the P-FET P5. Therefore, the control node 60 becomes decoupled from ground and the control node 62 becomes coupled to the positive supply voltage rail $V_{DD}$. Thus, at the time $T_2$, the read-out signal RO switches to a logic low state, and is thus representative of the logic 0 data in the memory cell for an appropriate multiplexed output in the read operation. The logic low state of the read-out signal RO activates the P-FET P7.

At a time $T_3$, the pre-charge clock signal PCH is switched to a logic low state. Thus, at the time $T_3$, the bit line $BL_0$ is once again coupled to the positive supply voltage rail $V_{DD}$ via the P-FET P4 and the N-FET N7 deactivates. Accordingly, the bit line $BL_0$ begins to ramp back up from a logic low state to a pre-charged logic high state. In addition, both the P-FET P8 and the N-FET N8 become activated. Because the P-FET P7 was already activated at approximately the time $T_2$, the control node 62 becomes coupled to the positive supply voltage rail $V_{DD}$ via the P-FETs P7 and P8. Therefore, the logic 0 data of the read-out signal RO becomes latched at the falling edge of the pre-charge clock signal PCH, at the time $T_3$. In addition, the output of the inverter 66 switches logic high and activates the N-FET N6, thus sinking the control node 60 to ground. Accordingly, the control node 60 is rapidly reset, but the deactivated N-FET N7 isolates the logic low state of the control node 60 from the logic high state of the control node 62.

At a time $T_4$, the bit line $BL_0$ has achieved a fully pre-charged logic high state. It is to be understood that, absent the rapid reset operation of the inverter 66 and the N-FET N6, the control node 60 would have a floating voltage potential until sometime between the time $T_3$ and the time $T_4$ based on the activation of the N-FET N5 resulting from the ramping voltage potential of the bit line $BL_0$. Also at the time $T_4$, the column select signal $CS_0$ is de-asserted, thus signaling the end of the read operation of the memory cell for which the bit line $BL_0$ corresponds. It is to be understood that, although illustrated as occurring concurrently at the time $T_4$, the switching of the column select signal $CS_0$ and the bit line $BL_0$ achieving a fully pre-charged logic high state may be unrelated events. As such, they may not necessarily occur at substantially the same time.

At a time $T_5$, the pre-charge clock signal PCH is once again switched to a logic high state. Thus, at the time $T_5$, another read operation of a different memory cell could occur, for example, for the memory cell corresponding to any one of the bit lines $BL_1$, $BL_2$, and $BL_3$. For example, a read operation could occur for a different one of the bit lines $BL_0$, $BL_1$, $BL_2$, and $BL_3$ at each period of the pre-charge clock signal PCH.

Figure 8:
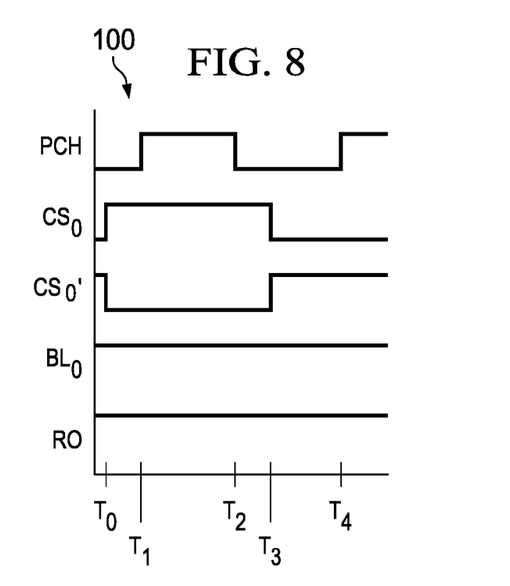
FIG. 8 illustrates another example of a timing diagram associated with the column multiplexer of the example of FIG. 4 in accordance with an aspect of the invention.

FIG. 8 illustrates another example of a timing diagram 100 associated with the column multiplexer 50 in the example of FIG. 4 in accordance with an aspect of the invention. In the example of FIG. 8, a memory cell corresponding to the bit line $BL_0$ stores logic 1 data, and the previous latched data of the read-out signal RO is logic 1.

At a time $T_0$, the column select signal $CS_0$ is asserted from a logic low state to a logic high state. Likewise, the complement of the column select signal $CS_0'$ switches from a logic high state to a logic low state. Accordingly, the memory cell corresponding to the bit line $BL_0$ is selected for a read operation. At a time prior to $T_0$, the pre-charge clock signal PCH was switched to a logic low state. As such, the bit line $BL_0$ is pre-charged to a logic high state due to the coupling of the bit line $BL_0$ to the positive supply voltage rail $V_{DD}$ via the P-FET P4. Therefore, the control node 60 is sunk to ground via the N-FETs N4 and N5, as well as the inverter 66 and the N-FET N6. In addition, both the N-FET N8 and the N-FET N9 are activated prior to the time $T_0$ to couple the control node 62 to ground, thus maintaining latched logic 1 data of the read-out signal RO.

At a time $T_1$, the pre-charge clock signal PCH switches to a logic high state. As such, the P-FET P4 deactivates and decouples the bit line $BL_0$ from the positive supply voltage rail $V_{DD}$. Also due to the logic high state of the pre-charge clock signal PCH at the time $T_1$, the N-FET N6, the N-FET N8, and the P-FET P8 all deactivate, and the N-FET N7 activates. As the bit line $BL_0$ remains at a logic high state at the time $T_1$, despite the decoupling of the bit line $BL_0$ from the positive supply voltage rail $V_{DD}$, the control node 60 remains sunk to ground via the N-FETs N4 and N5. Therefore, the control node 62 remains at the logic low state of the control node 60, and the read-out signal RO remains at a logic high state. In addition, the logic high state of the read-out signal RO maintains the activation of the N-FET N9. As the voltage potential of the bit line $BL_0$ does not decay, the logic state of the control node 62, and thus the read-out signal RO, remains steady.

At a time $T_2$, the pre-charge clock signal PCH is switched to a logic low state. Thus, at the time $T_2$, the bit line $BL_0$ is once again coupled to the positive supply voltage rail $V_{DD}$ via the P-FET P4 and the N-FET N7 deactivates. In addition, both the P-FET P8 and the N-FET N8 become activated. Because the N-FET N9 has not deactivated, the control node 62 becomes coupled to ground again via the N-FETs N8 and N9. Therefore, the logic 1 data of the read-out signal RO becomes latched at the falling edge of the pre-charge clock signal PCH, at the time $T_2$.

At the time $T_3$, the column select signal $CS_0$ is de-asserted, thus signaling the end of the read operation of the memory cell for which the bit line $BL_0$ corresponds. At a time $T_4$, the pre-charge clock signal PCH is once again switched to a logic high state. Thus, at the time $T_4$, another read operation of a different memory cell could occur, for example, for the memory cell corresponding to any one of the bit lines $BL_1$, $BL_2$, and $BL_3$. For example, a read operation could occur for a different one of the bit lines $BL_0$, $BL_1$, $BL_2$, and $BL_3$ at each period of the pre-charge clock signal PCH.

Figure 9:
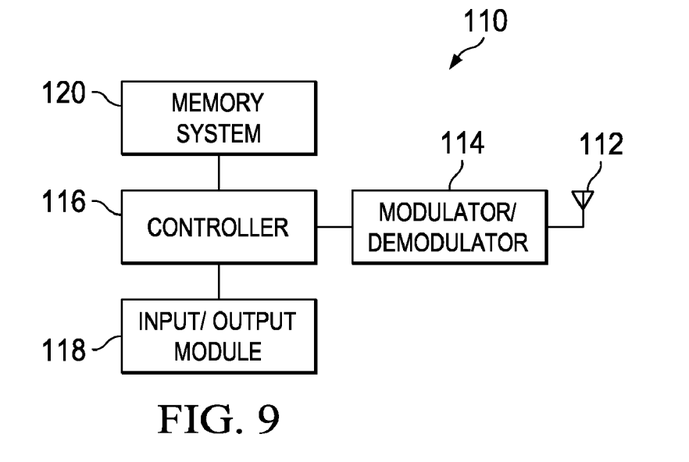
FIG. 9 illustrates a block diagram of a mobile communication device including a memory read system in accordance with an aspect of the invention

An SRAM that is configured to include bit sensing, multiplexing, and/or latching capability in column multiplexers, such as the column multiplexer 20 in the example of FIG. 2 or the column multiplexer in the example of FIG. 4, can be utilized in any of a variety of applications. An example of such an application is depicted in FIG. 9. FIG. 9 illustrates an example of a mobile communication device (MCD) 110, such as a cellular telephone. Wireless signals are transmitted from and received at an antenna 112. The MCD 110 also includes a transceiver 114, a controller 116, and an input/output module 118, which could include a microphone and receiver. Wireless signals received at the antenna 112 are demodulated at the transceiver 114 and sent to the controller 116, such that the signals can be properly interpreted by the controller 116 as voice data for a user of the MCD 110 at the input/output module 118. Similarly, user voice signals from the input/output module 118 can be sent to the transceiver 114 via the controller 116 to be modulated into a wireless signal that is transmitted from the antenna 112.

The MCD 110 also includes a memory system 120. The memory system could include both volatile and non-volatile memory. The non-volatile memory could include information such as stored phone numbers and digital photographs. The volatile memory, which could include one or more SRAM memory circuits, could be used to store connection information, such as control information between the MCD 110 and a cell tower that is serving the MCD 110. Accordingly, as it is desirous to maintain high performance and to reduce circuitry overhead to maintain a smaller size of the MCD, the volatile memory within the memory system 120 could include one or more SRAM circuits in accordance with an aspect of the invention.

For example, an SRAM circuit could include a memory array having a plurality of column multiplexers. Each of the column multiplexers could receive a plurality of single-ended bit line signals that could be associated with accessed data in a corresponding memory column. The bit line signals can be individually selected via at least one column select signal. The bit line signals can be pre-charged by a pre-charge clock signal, and, upon being pre-charged, the selected bit line signals can activate a switch that couples a control node to either a negative supply voltage rail or ground. A logic state of the control node can be inverted at the output of the column multiplexer to represent the data that is stored in the given accessed memory cell. In addition, the column multiplexer can be configured to latch the data output by the column multiplexer.

Figure 10:
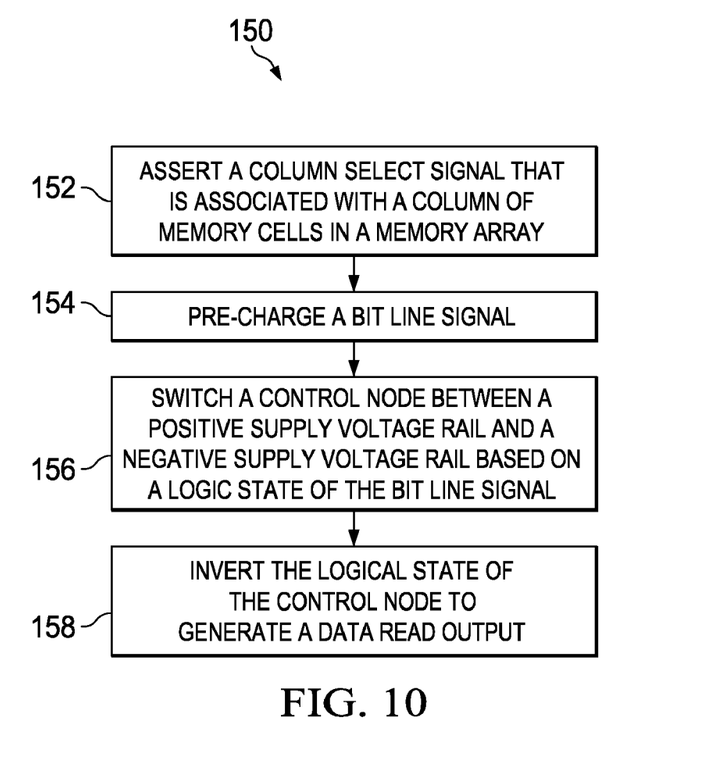
FIG. 10 illustrates a method for reading data from a memory array in accordance with an aspect of the invention.

In view of the foregoing structural and functional features described above, certain methods will be better appreciated with reference to FIG. 10. It is to be understood and appreciated that the illustrated actions, in other embodiments, may occur in different orders and/or concurrently with other actions. Moreover, not all illustrated features may be required to implement a method.

FIG. 10 illustrates a method 150 for reading data from a memory array in accordance with an aspect of the invention. At 152, a column select signal that is associated with a column of memory cells in a memory array is asserted. The column select signal can be one of a plurality of column select signals in a given column multiplexer. In addition, a complement of the column select signal can be input into or generated within the column select multiplexer. At 154, a bit line signal is pre-charged. The bit-line signal can be associated with data that is stored in a memory cell of the column of memory cells. The pre-charging of the bit line signal can be associated with a pre-charge clock signal activating a switch to couple the bit line signal to a positive supply voltage rail $V_{DD}$.

At 156, a control node is switched between a positive supply voltage rail and a negative supply voltage rail based on a logic state of the bit line signal. The negative supply voltage rail can be ground. The switching can occur based on the bit line signal activating one of two switches. The logic state of the bit line signal can be a logic high state resulting from logic 1 data stored in the associated memory cell. Alternatively, the logic state of the bit line signal can decay from a pre-charged logic high state to a logic low state resulting from logic 0 data being stored in the associated memory cell. The switching of the control node can be dynamic, or it can be latched based on latching switches coupled to the output of the column multiplexer and/or the pre-charge clock signal. At 158, the logic state of the control node is inverted to generate a data read output. The data read output can correspond to the data stored in the memory cell of the column of memory cells. The data read output can be dynamic, or it can be latched for a period of the pre-charge clock signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A column multiplexer for accessing data from a memory array, the column multiplexer comprising:
   an output node having a logic state that is based on a logic state of a control node; and
   a plurality of column elements, each of the plurality of column elements comprising:
      a first pair of series connected switches controlled by a bit line signal and a column select signal, the bit line signal being associated with data stored in one of a plurality of memory cells, the first pair of series connected switches being configured to set the control node to a logic low state based on a logic state of the bit line signal; and
      a second pair of series connected switches controlled by the bit line signal and a complement of the column select signal and being configured to set the control node to a logic high state based on the logic state of the bit line signal.

2. The column multiplexer of claim 1, wherein the first pair of series connected switches are interconnected between the control node and a negative supply voltage rail and comprise a first N-type field effect transistor (FET) having a gate terminal coupled to the bit line signal and a second N-type FET having a gate terminal coupled to the column select signal, and wherein the second pair of series connected switches are interconnected between the control node and a positive supply voltage rail and comprise a first P-type FET having a gate terminal coupled to the bit line signal and a second P-type PET having a gate terminal coupled to the complement of the column select signal.

3. The column multiplexer of claim 2, wherein, upon the data stored in the respective one of the plurality of memory cells being logic 0, the logic state of the bit line signal decays from a pre-charged logic high state to a logic low state, such that the first N-type FET decouples the control node from the negative supply voltage rail and the first P-type FET couples the control node to the positive supply voltage rail.

4. The column multiplexer of claim 1, wherein each of the plurality of column elements further comprises a switch operative to couple the respective bit line signal to a positive supply voltage rail based on a pre-charge clock signal.

5. The column multiplexer of claim 4, further comprising an inverter and an N-type FET connected in series and configured to reset the control node to a logic low state based on the pre-charge clock signal.

6. The column multiplexer of claim 4, wherein the control node is a first control node, the column multiplexer further comprising an N-type FET configured to switch the first control node to a logic state of a second control node once per cycle of the pre-charge clock signal, the first pair of series connected switches being interconnected between the second control node and a negative supply voltage rail and the second pair of series connected switches being interconnected between the first control node and the positive supply voltage rail.

7. The column multiplexer of claim 4, further comprising:
   an inverter interconnecting the control node and the output node;
   a pair of series connected P-type FETs interconnecting the control node and the positive supply voltage rail and configured to latch the control node to a logic high state based on the pre-charge clock signal and the output node; and
   a pair of series connected N-type FETs interconnecting the control node and a negative supply voltage rail and configured to latch the control node to a logic low state based on a complement of the pre-charge clock signal and the output node.

8. A mobile communication device comprising the column multiplexer of claim 1.

* * * * *